United States Patent
Sharma (10) Patent No.: US 12,341,005 B2
(45) Date of Patent: Jun. 24, 2025

(54) FORMATION OF SiCN THIN FILMS

(71) Applicant: ASM IP Holding B.V., Almere (NL)

(72) Inventor: Varun Sharma, Helsinki (FI)

(73) Assignee: ASM IP Holding B.V., Almere (NL)

( * ) Notice: Subject to any disclaimer, the term of this patent is extended or adjusted under 35 U.S.C. 154(b) by 495 days.

(21) Appl. No.: 17/141,049

(22) Filed: Jan. 4, 2021

(65) Prior Publication Data

US 2021/0225634 A1  Jul. 22, 2021

Related U.S. Application Data (60) Provisional application No. 62/962,575, filed on Jan. 17, 2020.

(51) Int. Cl.
    *H01L 21/02* (2006.01)

(52) U.S. Cl.
    CPC .... *H01L 21/0228* (2013.01); *H01L 21/02167* (2013.01); *H01L 21/02315* (2013.01)

(58) Field of Classification Search
    CPC ........... H01L 21/0228; H01L 21/02126; H01L 21/02167; H01L 21/02315; H01L 21/02211; H01L 21/02216; H01L 21/76205; H01L 21/76224; H01L 21/76264; H01L 21/022; H01L 21/02312; H01L 21/02123; H01L 21/02118; H01L 21/02263; H01L 1/76224; H01L 21/76202
    USPC ........................................................ 438/778
    See application file for complete search history.

(56) References Cited

U.S. PATENT DOCUMENTS

| | | | |
|---|---|---|---|
| 3,708,728 A | 1/1973 | Sterling et al. |
| 3,925,337 A | 12/1975 | Heiberger |
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |

(Continued)

FOREIGN PATENT DOCUMENTS

| | | |
|---|---|---|
| CN | 1265110 | 8/2000 |
| EP | 0387403 | 9/1990 |

(Continued)

OTHER PUBLICATIONS

Shang; Chen et al., Selective Deposition of Metallic Films (KR 102234260 B1, [Annotated Foreign Patent Reference]), Published: Apr. 1, 2021, Filed May 8, 2018, pp. 12-13. (Year: 2021).*

(Continued)

*Primary Examiner* — Bitew A Dinke
(74) *Attorney, Agent, or Firm* — Banner & Witcoff, Ltd.

(57) ABSTRACT

Methods for depositing silicon-containing thin films, such as SiCN films, on a substrate in a reaction space are provided. The methods can include a vapor deposition process utilizing a vapor-phase silicon precursor comprising a halogen and a second vapor-phase reactant comprising an amine reactant. In some embodiments an atomic layer deposition (ALD) cycle comprises alternately and sequentially contacting the substrate with a silicon precursor comprising a halogen and a second reactant comprising an amine reactant. In some embodiments a SiCN thin film is deposited by alternately contacting the substrate with a halosilane such as octachlorotrisilane and an amine reactant comprising a diamine or triamine.

15 Claims, 2 Drawing Sheets

(56) References Cited

U.S. PATENT DOCUMENTS

| | | |
|---|---|---|
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,482,262 A | 1/1996 | Hayakawa et al. |
| 5,595,784 A | 1/1997 | Kaim et al. |
| 5,603,771 A | 2/1997 | Seiberras et al. |
| 5,618,395 A | 4/1997 | Gartner |
| 5,645,947 A | 7/1997 | Hirooka et al. |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,159,871 A | 12/2000 | Loboda et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,410,462 B1 | 6/2002 | Yang et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,583,048 B2 | 6/2003 | Vincent et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,048,900 B2 | 5/2006 | Mathur et al. |
| 7,074,690 B1 | 7/2006 | Gauri et al. |
| 7,115,534 B2 | 10/2006 | Nguyen et al. |
| 7,115,974 B2 | 10/2006 | Wu et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,329,590 B2 | 2/2008 | Elers et al. |
| 7,405,158 B2 | 7/2008 | Lai et al. |
| 7,410,666 B2 | 8/2008 | Elers et al. |
| 7,416,981 B2 | 8/2008 | Lee et al. |
| 7,611,751 B2 | 11/2009 | Elers |
| 7,749,871 B2 | 7/2010 | Elers et al. |
| 7,771,533 B2 | 8/2010 | Tois et al. |
| 7,776,396 B2 | 8/2010 | Kobrin et al. |
| 7,794,798 B2 | 9/2010 | Hautala |
| 7,824,492 B2 | 11/2010 | Tois et al. |
| 8,217,446 B2 | 7/2012 | Fukuzumi et al. |
| 8,637,411 B2 | 1/2014 | Swaminathan et al. |
| 8,647,993 B1 | 2/2014 | LaVoie et al. |
| 8,703,624 B2 | 4/2014 | Yang et al. |
| 9,076,646 B2 | 7/2015 | Sims et al. |
| 9,111,746 B2 | 8/2015 | Ranjan et al. |
| 9,171,736 B2 | 10/2015 | Raley et al. |
| 9,200,167 B2 | 12/2015 | Spence et al. |
| 9,243,324 B2 | 1/2016 | Bowen et al. |
| 9,287,113 B2 | 3/2016 | Kang et al. |
| 9,425,038 B2 | 8/2016 | Shimizu |
| 9,425,097 B1 | 8/2016 | Bouche et al. |
| 9,443,718 B2 | 9/2016 | Harada et al. |
| 9,455,138 B1 | 9/2016 | Fukazawa et al. |
| 9,472,391 B2 | 10/2016 | Shimamoto et al. |
| 9,620,357 B2 * | 4/2017 | Hashimoto ....... H01L 21/31116 |
| 9,784,695 B2 | 10/2017 | Blendl |
| 9,786,491 B2 | 10/2017 | Suzuki et al. |
| 9,786,492 B2 | 10/2017 | Suzuki et al. |
| 9,865,455 B1 * | 1/2018 | Sims ................ C23C 16/45527 |
| 9,895,715 B2 | 2/2018 | Haukka et al. |
| 10,008,428 B2 | 6/2018 | Kang et al. |
| 10,186,420 B2 | 1/2019 | Fukazawa |
| 10,424,476 B2 | 9/2019 | Suzuki et al. |
| 10,424,477 B2 | 9/2019 | Niskanen et al. |
| 10,453,675 B2 | 10/2019 | O'Neill |
| 10,504,901 B2 | 12/2019 | Yoo et al. |
| 10,510,529 B2 | 12/2019 | Suzuki et al. |
| 10,600,637 B2 | 3/2020 | Suzuki et al. |
| 10,787,591 B2 | 9/2020 | Tsotsis et al. |
| 10,847,529 B2 | 11/2020 | Yoo et al. |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0155722 A1 * | 10/2002 | Satta ................ H01L 23/53252 257/E21.582 |
| 2002/0182320 A1 | 12/2002 | Leskela et al. |
| 2003/0015764 A1 | 1/2003 | Raaijmakers |
| 2003/0026989 A1 | 2/2003 | George et al. |
| 2003/0031793 A1 | 2/2003 | Chang et al. |
| 2003/0049931 A1 | 3/2003 | Byun et al. |

(56) References Cited

U.S. PATENT DOCUMENTS

| | | |
|---|---|---|
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0119305 A1 | 6/2003 | Huang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0163927 A1* | 7/2005 | McSwiney ............ C07F 7/025 427/248.1 |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1* | 4/2006 | Elers .................. H01L 21/76807 257/E21.582 |
| 2006/0079090 A1 | 4/2006 | Elers et al. |
| 2006/0079099 A1 | 4/2006 | Nguyen et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0228903 A1* | 10/2006 | McSwiney .......... H01L 21/0217 257/E21.267 |
| 2006/0240187 A1 | 10/2006 | Weidman |
| 2007/0054046 A1 | 3/2007 | Ishizaka et al. |
| 2007/0072427 A1 | 3/2007 | Fukushima et al. |
| 2007/0148350 A1 | 6/2007 | Rahtu et al. |
| 2007/0218670 A1 | 9/2007 | Ishizaka |
| 2007/0232082 A1 | 10/2007 | Balseanu et al. |
| 2007/0251444 A1 | 11/2007 | Gros-Jean et al. |
| 2008/0081470 A1 | 4/2008 | Clark |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0209081 A1* | 8/2009 | Matero ................ C23C 16/401 257/E21.546 |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0148903 A1 | 6/2010 | Yin et al. |
| 2010/0210118 A1 | 8/2010 | Mizuno |
| 2010/0233886 A1* | 9/2010 | Yang .................... C23C 16/401 438/786 |
| 2010/0239742 A1 | 9/2010 | Larson-Smith et al. |
| 2010/0297545 A1 | 11/2010 | Yoo et al. |
| 2010/0330425 A1 | 12/2010 | Lopatin et al. |
| 2011/0159202 A1 | 6/2011 | Matsushita et al. |
| 2011/0262642 A1 | 10/2011 | Xiao et al. |
| 2011/0278533 A1 | 11/2011 | Hillhouse et al. |
| 2012/0003831 A1 | 1/2012 | Kang et al. |
| 2012/0119283 A1 | 5/2012 | Lee et al. |
| 2012/0122302 A1* | 5/2012 | Weidman .......... H01L 21/02274 118/723 R |
| 2012/0141770 A1 | 6/2012 | Cadet et al. |
| 2012/0208347 A1 | 8/2012 | Hwang et al. |
| 2012/0269962 A1* | 10/2012 | Blomberg .......... C23C 16/45531 427/126.3 |
| 2013/0034963 A1 | 2/2013 | Chung et al. |
| 2013/0078454 A1 | 3/2013 | Thompson et al. |
| 2013/0084714 A1 | 4/2013 | Oka et al. |
| 2013/0112605 A1 | 5/2013 | Wyndham et al. |
| 2013/0115763 A1 | 5/2013 | Takamure et al. |
| 2013/0134372 A1 | 5/2013 | Sakuma et al. |
| 2013/0196082 A1 | 8/2013 | Spence |
| 2013/0196516 A1* | 8/2013 | Lavoie ............. C23C 16/45536 257/E21.293 |
| 2013/0330935 A1 | 12/2013 | Varadarajan |
| 2014/0030432 A1 | 1/2014 | Leu et al. |
| 2014/0030448 A1* | 1/2014 | Bowen ................ C23C 16/325 427/255.28 |
| 2014/0048131 A1 | 2/2014 | Tanaka et al. |
| 2014/0272194 A1 | 9/2014 | Xiao et al. |
| 2014/0273477 A1 | 9/2014 | Niskanen et al. |
| 2014/0273528 A1* | 9/2014 | Niskanen .......... H01L 21/02211 438/792 |
| 2014/0273531 A1* | 9/2014 | Niskanen .......... H01L 21/0228 438/793 |
| 2014/0295109 A1 | 10/2014 | Sakakura |
| 2014/0302267 A1 | 10/2014 | Wynne et al. |
| 2014/0349107 A1 | 11/2014 | Thoumazet et al. |
| 2014/0349492 A1* | 11/2014 | Shimamoto ....... C23C 16/45534 438/786 |
| 2014/0367764 A1 | 12/2014 | Lee et al. |
| 2015/0021599 A1* | 1/2015 | Ridgeway ............ H01L 29/247 257/43 |
| 2015/0087156 A1 | 3/2015 | Kamimura et al. |
| 2015/0118865 A1* | 4/2015 | Shimizu ............ C23C 16/45527 438/786 |
| 2015/0126042 A1 | 5/2015 | Pasquale et al. |
| 2015/0147484 A1* | 5/2015 | Nguyen ............ C23C 16/45536 427/535 |
| 2015/0162185 A1* | 6/2015 | Pore .................. C23C 16/45553 438/786 |
| 2015/0214103 A1 | 7/2015 | Matsuda |
| 2015/0217240 A1 | 8/2015 | Van Tuel et al. |
| 2015/0252477 A1* | 9/2015 | Nguyen ............ C23C 16/45531 427/255.394 |
| 2015/0275355 A1 | 10/2015 | Mallikarjunan et al. |
| 2015/0303056 A1 | 10/2015 | Varadarajan et al. |
| 2015/0303101 A1 | 10/2015 | Blomberg et al. |
| 2015/0348778 A1* | 12/2015 | Shimizu ............ H01L 21/02167 438/786 |
| 2015/0376211 A1* | 12/2015 | Girard .................. C23C 16/308 556/412 |
| 2015/0380302 A1 | 12/2015 | Mountsier et al. |
| 2016/0002039 A1* | 1/2016 | Thompson ........ C23C 16/45525 427/255.394 |
| 2016/0020091 A1* | 1/2016 | Saly .................. H01L 21/02529 438/767 |
| 2016/0064281 A1 | 3/2016 | Izumi et al. |
| 2016/0093485 A1 | 3/2016 | Kobayashi et al. |
| 2016/0108064 A1* | 4/2016 | Kuchenbeiser ......... C23C 16/18 546/14 |
| 2016/0115593 A1* | 4/2016 | Kuchenbeiser ....... C01B 21/068 216/99 |
| 2016/0177445 A1* | 6/2016 | Takahashi ........ C23C 16/45591 118/728 |
| 2016/0225616 A1 | 8/2016 | Li et al. |
| 2016/0276148 A1* | 9/2016 | Qian .................. H01L 21/02164 |
| 2016/0307751 A1 | 10/2016 | Pore |
| 2016/0336338 A1 | 11/2016 | Song et al. |
| 2017/0140924 A1 | 5/2017 | Suzuki et al. |
| 2017/0213726 A1 | 7/2017 | Saley et al. |
| 2017/0301539 A1 | 10/2017 | Sano et al. |
| 2017/0309476 A1 | 10/2017 | Venkatasubramanian et al. |
| 2017/0323775 A1* | 11/2017 | Saly ................ H01L 21/02126 |
| 2017/0323782 A1* | 11/2017 | Suzuki ................ H01L 21/0228 |
| 2017/0342559 A1* | 11/2017 | Fukazawa ......... C23C 16/45531 |
| 2017/0352680 A1 | 12/2017 | Shin et al. |
| 2017/0365462 A1 | 12/2017 | Varadarajan |
| 2018/0005814 A1 | 1/2018 | Kumar et al. |
| 2018/0013078 A1 | 1/2018 | Lee et al. |

(56) References Cited

U.S. PATENT DOCUMENTS

| | | | |
|---|---|---|---|
| 2018/0022761 A1* | 1/2018 | Girard | C23C 16/308 556/412 |
| 2018/0122742 A1 | 5/2018 | Ha et al. | |
| 2018/0151355 A1* | 5/2018 | Fukazawa | H01L 21/02118 |
| 2018/0163312 A1 | 6/2018 | Blomberg et al. | |
| 2018/0179628 A1 | 6/2018 | Hashimoto et al. | |
| 2018/0182618 A1 | 6/2018 | Blanquart et al. | |
| 2018/0269055 A1* | 9/2018 | Hashimoto | C23C 16/45527 |
| 2018/0291505 A1* | 10/2018 | Nguyen | C23C 16/45536 |
| 2018/0350587 A1 | 12/2018 | Jia et al. | |
| 2018/0366314 A1* | 12/2018 | Niskanen | H01L 21/02274 |
| 2018/0366319 A1 | 12/2018 | Coley et al. | |
| 2019/0027357 A1 | 1/2019 | Girard et al. | |
| 2019/0311894 A1* | 10/2019 | Girard | C23C 16/308 |
| 2020/0010954 A1* | 1/2020 | Bhuyan | C23C 16/45536 427/535 |
| 2020/0075322 A1 | 3/2020 | Suzuki et al. | |
| 2020/0161438 A1* | 5/2020 | Tang | H01L 21/02145 |
| 2020/0273697 A1 | 8/2020 | Suzuki et al. | |
| 2020/0332415 A1* | 10/2020 | Bhuyan | C23C 16/36 |
| 2020/0388486 A1 | 12/2020 | Manna et al. | |
| 2020/0395211 A1* | 12/2020 | Jia | C23C 16/45542 |
| 2021/0101917 A1* | 4/2021 | Khandelwal | H01L 21/0228 438/793 |
| 2021/0101918 A1* | 4/2021 | Hwang | C23C 16/45591 118/728 |
| 2021/0134586 A1 | 5/2021 | Maes et al. | |
| 2021/0225633 A1* | 7/2021 | Sharma | H01L 21/022 |
| 2022/0234903 A1* | 7/2022 | Pearlstein | C23C 16/401 |

FOREIGN PATENT DOCUMENTS

| | | | |
|---|---|---|---|
| EP | 0394054 | 10/1990 | |
| EP | 0442490 | 8/1991 | |
| EP | 0526779 | 2/1993 | |
| EP | 0528779 | 2/1993 | |
| EP | 0573033 | 12/1993 | |
| EP | 0774533 | 5/1997 | |
| EP | 0899779 | 3/1999 | |
| EP | 1158070 | 11/2001 | |
| EP | 1167567 | 1/2002 | |
| EP | 2620440 | 7/2013 | |
| EP | 3196336 | 7/2017 | |
| GB | 2148328 | 5/1985 | |
| JP | 58-033841 | 2/1983 | |
| JP | H06-037041 | 2/1994 | |
| JP | H06-069157 | 3/1994 | |
| JP | H07-230957 | 8/1995 | |
| JP | H08-264530 | 10/1996 | |
| JP | H09-55365 | 2/1997 | |
| JP | 09-087857 | 3/1997 | |
| JP | 2003-342731 | 12/2003 | |
| JP | 2004-288979 | 10/2004 | |
| JP | 2006-040936 | 2/2006 | |
| JP | 2009-083511 | 4/2009 | |
| JP | 2015-144268 | 8/2015 | |
| KR | 2003-0016346 | 2/2003 | |
| KR | 2003-0057938 | 7/2003 | |
| KR | 2003-0093575 | 12/2003 | |
| KR | 2004-0060402 | 7/2004 | |
| KR | 2004-0079173 | 9/2004 | |
| KR | 2004-0079175 | 9/2004 | |
| KR | 2004-0100767 | 12/2004 | |
| KR | 2005-0000168 | 1/2005 | |
| KR | 2018-005128 | 1/2018 | |
| KR | 102234260 B1 * | 4/2021 | H01L 21/76838 |
| TW | 2010-210202 | 1/2010 | |
| TW | 2014-03759 | 1/2014 | |
| WO | WO 1996/17107 | 6/1996 | |
| WO | WO 1996/18756 | 6/1996 | |
| WO | WO 1998/51838 | 11/1998 | |
| WO | WO 1999/37655 | 7/1999 | |
| WO | WO 2000/01006 | 1/2000 | |
| WO | WO 2000/04704 | 1/2000 | |
| WO | WO 2000/40772 | 7/2000 | |
| WO | WO 2000/47404 | 8/2000 | |
| WO | WO 2000/47796 | 8/2000 | |
| WO | WO 2000/54320 | 9/2000 | |
| WO | WO 2000/55895 | 9/2000 | |
| WO | WO 2000/63957 | 10/2000 | |
| WO | WO 2001/27347 | 4/2001 | |
| WO | WO 2001/29280 | 4/2001 | |
| WO | WO 2001/29891 | 4/2001 | |
| WO | WO 2001/29893 | 4/2001 | |
| WO | WO 2001/53565 | 7/2001 | |
| WO | WO 2001/66832 | 9/2001 | |
| WO | WO 2001/78213 | 10/2001 | |
| WO | WO 2001/88972 | 11/2001 | |
| WO | WO 2004/077515 | 9/2004 | |
| WO | WO 2006/080782 | 8/2006 | |
| WO | WO 2006/097525 | 9/2006 | |
| WO | WO 2007/041089 | 4/2007 | |
| WO | WO 2008/051851 | 5/2008 | |
| WO | WO-2008051851 A1 * | 5/2008 | C23C 16/32 |
| WO | WO 2008/121478 | 10/2008 | |
| WO | WO 2008/137399 | 11/2008 | |
| WO | WO 2013/043330 | 3/2013 | |
| WO | WO 2018/204709 | 11/2018 | |
| WO | WO 2018/213018 | 11/2018 | |

OTHER PUBLICATIONS

1988RD-0296076 (Nov. 20, 1998), Field effect transistor structure with improved transconductant—contg. spacer-less conducting gate oxide, and tungsten deposited on source and drain, East Version 2.0.1.4 Patent-Assignee: Anonymous[ANON], Sep. 19, 2005.

Aarik et al., "Influence of substrate temperature on atomic layer growth and properties of HfO2 thin films", Thin Solid Films, vol. 340, 1999, pp. 110-116.

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Amano et al., "Improved brushing durability of titanium dioxide coating on polymethyl methacrylate substrate by prior treatment with acryloxypropyl trimethoxysilane-based agent for denture application", Dental Materials Journal 2010, 29(1): pp. 97-103.

Andricacos et al., "Damascene copper electroplating for chip", IBM Jour. Research and Dev., 1998, vol. 42, Issue 5, pp. 567-574.

Bain et al., "Deposition of tungsten by plasma enhanced chemical vapour deposition", J. Phys. IV France, 1999, vol. 9, pp. 827-833.

Chang et al, "Chemical Vapor Deposition of Tantalum Carbide and Carbonitride Thin Films from Me3CE=Ta(CH2CMe3)3 (E = CH, N)," J. Mater. Chem. 13:365-369 (2003).

Chookarjorn et al, "Design of Stable Nanocrystalline Alloys," Science Magazine, vol. 337, pp. 951-954, Aug. 24, 2012.

Closser et al., "Molecular Layer Deposition of a Highly Stable Oxycarbide Thin Film Using an Organic Chlorosilane and Water", ACS Appl. Mater. Interfaces 2018, 10, pp. 24266-24274.

Diaz-Benito et al., "Hydrolysis study of bis-1,2-(triethoxylsilyl)ethane silane by NMR", Colloids and Surfaces A; Physicochemical and Engineering Aspects, 369 (2010), pp. 53-56.

Elers et al., "NbC15 as a precursor in atomic layer epitaxy", Applied Surface Science, Jul. 9, 1994, vol. 82/83, pp. 468-474.

Favis et al., "Atomic layer epitaxy of silicon, silicon/germanium and silicon carbide via extraction/exchange processes", Avail. NTIS. Report, 1991, pp. 33.

File History of U.S. Appl. No. 14/939,984, filed Nov. 12, 2015.
File History of U.S. Appl. No. 15/707,749, filed Sep. 18, 2017.
File History of U.S. Appl. No. 15/707,878, filed Sep. 18, 2017.
File History of U.S. Appl. No. 15/588,026, filed May 5, 2017.
File History of U.S. Appl. No. 16/603,555, filed Oct. 7, 2019.
File History of U.S. Appl. No. 15/787,342, filed Oct. 18, 2017.
File History of U.S. Appl. No. 15/951,626, filed Apr. 12, 2018.
File History of U.S. Appl. No. 15/951,644, filed Apr. 12, 2018.
File History of U.S. Appl. No. 16/208,350, filed Dec. 3, 2018.
File History of U.S. Appl. No. 17/072,480, filed Oct. 16, 2020.
File History of U.S. Appl. No. 16/811,258, filed Mar. 6, 2020.

(56) References Cited

OTHER PUBLICATIONS

Fuyuki et al., "Atomic layer epitaxy controlled by surface superstructures in silicon carbide", Thin Solid Films, 1993, vol. 225, Issue 1-2, pp. 225-229.
Fuyuki et al., "Atomic layer epitaxy of cubic silicon carbide by gas source MBE using surface superstructure", J. Cryst. Growth, 1989, vol. 95, Issue 1-4, pp. 461-463.
Gallis et al., "White light emission from amorphous silicon oxycarbide (a-SiCxOy) thin films: Role of composition and postdeposition annealing", Applied Physics Letters 97, 2010, pp. 0810905-1-0810905-3.
Girolami et al., "Tailored Organometallics as Low-Temperature CVD Precursors to Thin Films", Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., "Atomic layer control of .beta.-silicon carbide (001) surface", Springer Proc. Phys., 1992, pp. 90-95.
Hiltunen et al., "Nitrides of titanium, niobium, tantalum and molybdenum grown as thin films by the atomic layer epitaxy method", Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).i.
Ibrahim et al., "Organosilica bis(triethoxysilyl)ethane (BTESE) membranes for gas permeation (GS) and reverse osmosis (RO): The effect of preparation conditions on structure, and the correlation between gas and liquid permeation properties", Journal of Membrane Science, 526 (2017), pp. 242-251.
Ihanus et al., "ALE growth of ZnS1-xSex thin films by substituting surface sulfur with elemental selenium," Appl. Surface Sci., 112:154-158 (1997).
International Search Report and Written Opinion dated Apr. 7, 2008, Application No. PCT/US2007/082131.
International Search Report and Written Opinion dated Jun. 25, 2015 in Application No. PCT/US2015/023492.
Jehn et al., "Gmelin Handbook of Inorganic and Organometallic Chemistry", 8th Edition, 1993, vol. A 5b, Issue 54, pp. 131-154.
Jeon et al., "A Study on the Characteristics of TiN Thin Film Deposited by Atomic Layer Chemical Vapor Deposition Method", J. Vac .Sci. Technol. A, 2000, vol. 18, Issue 4, pp. 1595-1598.
Juppo et al., "Deposition of copper films by an alternate supply of CuCl and Zn", J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., "Atomic-layer-deposited WNxCy thin films as diffusion barrier for copper metallization", Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kirk-Othmer, Encyclopedia of Chemical Technology, John Wiley & Sons, Inc., 1992, vol. 4, pp. 841-878.
Klaus et al., "Atomic Layer Deposition of Tungsten Nitride Films Using Sequential Surface Reactions", Journal of the Electrochemical Society, 2000, vol. 147, Issue 3, pp. 1175-1181.
Klaus et al., "Atomic layer deposition of tungsten using sequential surface chemistry with a sacrificial stripping reaction", Thin Solid Films, 2000, vol. 360, pp. 145-153.
Klaus et al., "Atomic layer deposition of tungsten and tungsten nitride using sequential surface reactions", AVS 46th International Symposium, 1999, Seattle, WA, US.
Klaus et al., "Atomically controlled growth of tungsten and tungsten nitride using sequential surface reactions", Applied Surface Science, 2000, vol. 162-163, pp. 479-491.
Kukli et al., "Properties of (Nb1-xTax)2O5 Solid Solutions and (Nb1-xTax)2O5-ZrO2 Nanolaminates Growth by Atomic Layer Epitaxy", NanoStructured Materials, 1997, vol. 8, pp. 785-793.
Lai et al., "Precursors for Organometallic Chemical Vapor Deposition of Tungsten Carbide Films", Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Lee et al., "Characteristics of low-k SiOC films deposited via atomic layer deposition", Thin Solid Films 645 (2018), pp. 334-339.
Leskelä et al., "ALD precursor chemistry: Evolution and future challenges", Jour. Phys. IV France 9, 1999, pp. 837-852.
Ludviksson et al., "Low-Temperature Thermal CVD of Ti—Al Metal Films Using a Strong Reducing Agent", Chem. Vap. Deposition, 1998, vol. 4, Issue 4, pp. 129-132.
Martensson, "Use of atomic layer epitaxy for fabrication of Si/TiN/Cu structures", J. Vac. Sci. Technol. B, Sep./Oct. 1999, vol. 17, Issue 5, pp. 2122-2128.
Martensson et al., "Atomic Layer Epitaxy of Copper and Tantalum", Chemical Vapor Deposition, 1997, vol. 3, Issue 1, pp. 45-50.
Martensson et al., "CU(THD)2 As Copper Source in Atomic Layer Epitaxy", Electrochemical Society Proceedings, vol. 97-25, (1997) pp. 1529-1536.
Matsunami et al., "Hetero-interface control and atomic layer epitaxy of SiC", Applied Surface Science, 1997, vol. 112, pp. 171-175.
Min et al., "Atomic Layer Deposition of TiN Films by Alternate Supply of Tetrakis (ethylmethylamino)-Titanium and Ammonia", Jpn. J. Appl. Phys., 1998, vol. 37, pp. 4999-5004.
Min et al., "Atomic Layer Deposition of TiN Thin Films by Sequential Introduction of Ti Precursor and HN3", Mat. Res. Soc. Symp. Proc., 1998, vol. 514, pp. 337-342.
Nakajima et al., "Chemical Vapor Deposition of Tungsten Carbide, Molybdenum Carbide Nitride, and Molybdenum Nitride Films", J. Electrochem. Soc., Jun. 1997, vol. 144, Issue 6, pp. 2096-2100.
Polyakov et al., "Growth of GaBN Ternary Solutions by Organometallic Vapor Phase Epitaxy", Journal of Electronic Materials, 1997, vol. 26, Issue 3, pp. 237-242.
Ritala et al., "Atomic layer epitaxy growth of TiN thin films", J. Electrochem. Soc., 1995, vol. 142, Issue 8, pp. 2731-2737.
Ritala et al., "Atomic Layer Epitaxy Growth of TiN Thin Films from TiI4 and NH3", J. Electrochem. Soc., Aug. 1998, vol. 145, Issue 8, pp. 2914-2920.
Ritala et al., "Controlled Growth of TaN, Ta3N5, and TaOxNy Thin Films by Atomic Layer Deposition", Chem. Mater., 1999, vol. 11, pp. 1712-1718.
Ritala et al., "Effects of intermediate zinc pulses on properties of TiN and NbN films deposited by atomic layer epitaxy", Appl. Surf. Sci., 1997, vol. 120, pp. 199-212.
Ritala et al., "Perfectly conformal TiN and Al2O3 films deposited by atomic layer deposition", Chem. Vapor Deposition, 1999, vol. 5, pp. 7-9.
Ritala et al., "Surface roughness reduction in atomic layer epitaxy grown of titanium dioxide thin films", Thin Solid Films, vol. 249, pp. 155-162 (1994).
Sadayuki et al., "Sub-atomic layer growth of SiC at low temperatures", Japanese Journal of Applied Physics, 1995, vol. 34, Issue 11, pp. 6166-6170.
Sherman et al., "Plasma enhanced atomic layer deposition of Ta for diffusion barrier applications", AVS 46th International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Suntola, "Atomic Layer Epitaxy," Handbook of Crystal Growth 3, Ch. 14, pp. 601-663 (1994).
Teo et al., "Pre-treatments applied to oxidized aluminum surfaces to modify the interfacial bonding with bis-1, 2-(triethoxysilyl) ethane (56) References Cited

OTHER PUBLICATIONS (BTSE)—Part I. High-purity Al with native oxide", Applied Surface Science 252(5), 2005, pp. 1293-1304.
Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.
Tulhoff et al., Ullmann's Encyclopedia of Industrial Chemistry, 5th, Completely Revised Edition, 1986, vol. A5, pp. 61-77.
U.S. Appl. No. 10/049,125 filed Aug. 20, 2002 file history, including but not limited to, Office Action dated Apr. 8, 2004, Office Action dated Jun. 18, 2003, and Office Action dated Oct. 27, 2003.
U.S. Appl. No. 10/242,368 filed Sep. 12, 2002 file history, including but not limited to, Office Action dated Oct. 20, 2004, Office Action dated Apr. 27, 2004, and Notice of Allowance dated Jul. 19, 2005.
U.S. Appl. No. 10/969,297 filed Oct. 19, 2004 file history, including but not limited to, Office Action dated Oct. 11, 2006, Office Action dated Apr. 12, 2007, and Notice of Allowance dated Sep. 18, 2007.
U.S. Appl. No. 11/286,203 filed Nov. 22, 2005 file history, including but not limited to Office Action dated Sep. 28, 2007.
U.S. Appl. No. 11/288,872 filed Nov. 28, 2005 file history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.
U.S. Appl. No. 11/591,845 filed Nov. 1, 2006 file history, including but not limited to, Office Action dated Sep. 4, 2008, Office Action dated May 28, 2009, and Notice of Allowance dated Sep. 4, 2009.
U.S. Appl. No. 14/939,984, filed Nov. 12, 2015 file history, including but not limited to, Office Action dated Feb. 3, 2017, and Notice of Allowance dated Jun. 7, 2017.
U.S. Appl. No. 15/342,943, filed Nov. 3, 2016 file history, including but not limited to Notice of Allowance dated Jun. 13, 2017.
U.S. Appl. No. 14/255,799, filed Apr. 17, 2014 file history, including but not limited to, Office Action dated Dec. 1, 2016, Final Office Action dated Aug. 29, 2017, and Advisory Action dated Dec. 21, 2017.
Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).
Wahab et al., "Hybrid periodic mesoporous organosilica materials prepared from 1,2-bis(triethoxysilyl)ethane and (3-cyanopropyl)triethoxysilane", Microporous and Mesoporous Materials 69 (2004), pp. 19-27.
Wong et al., "Barriers for copper interconnections, Solid State Technology", 1999, pp. 1-7.
Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.
Yang et al., "Atomic Layer Deposition of Tungsten Film from WF6/B2H6: Nucleation Layer for Advanced Semiconductor Devices", Advanced Metallization Conference 2001 (AMC 2001), Conference Proceedings ULSI XVII@2002 Materials Research Society, 2001, pp. 655-660.
Zhang et al., "High permittivity thin film nanolaminates," Journal of Applied Physics, vol. 87, No. 4, pp. 1921-1924 (2000).
Filler et al., "Carboxylic Acid Chemistry at the Ge(100)-2 x 1 Interface: Bidentate Bridging Structure Formation on a Semiconductor Surface, Published, Dec. 22, 2005, J. Am. Chem. Soc. 2006, 128, 3, pp. 770-779.

\* cited by examiner

FORMATION OF SiCN THIN FILMS

REFERENCE TO RELATED APPLICATION

This application claims priority to U.S. Provisional Application No. 62/962,575, filed on Jan. 17, 2020, which is incorporated by reference herein in its entirety.

BACKGROUND

Field

The present disclosure relates generally to the field of semiconductor device manufacturing and, more particularly, to formation of silicon carbon nitride films.

Description of the Related Art

There is increasing need for dielectric materials with relatively low dielectric constant (k) values and relatively low acid-based or base-based wet etch rates. Typically, deposition processes for forming silicon containing carbonitride (SiCN) films require a nitrogen containing plasma step.

SUMMARY

In one aspect, methods for forming silicon-containing thin films such as Si(C,N) films are provided. In some embodiments methods of forming a silicon-containing thin film, such as a SiCN thin film, on a substrate comprise alternately and sequentially contacting the substrate with a silicon precursor comprising a halogen and an amine reactant.

In some embodiments a silicon-containing thin film is deposited on a substrate in a reaction chamber by an atomic layer deposition (ALD) process comprising at least one deposition cycle in which the substrate is contacted with a vapor phase silicon precursor comprising a halogen and a vapor phase amine reactant. In some embodiments two or more deposition cycles are carried out sequentially. In some embodiments the substrate is contacted with the silicon precursor and the amine reactant at a temperature of about 200 to about 400° C.

In some embodiments a plasma reactant is not utilized in at least one deposition cycle. That is, the substrate is not contacted with a plasma during the deposition cycle. In some embodiments plasma is not used during any deposition cycle. In some embodiments no plasma is used in the deposition process.

In some embodiments the silicon reactant has the formula $Si_nX_{2n+2}$, where X is a halogen and n is an integer greater than or equal to 1. In some embodiments the silicon precursor is an alkylhalosilane. In some embodiments the silicon precursor is octachlorotrisilane, hexachlorodisilane, pentachlorodisilane, silicon tetrachloride or trichlorosilane. In some embodiments the silicon precursor is a bridged halosilane, such as octachlorosiloxane or bis(trichlorosilyl)methane. In some embodiments the silicon precursor comprises two different halogens.

In some embodiments the amine reactant has a formula $C_aN_bH_c$, where a, b and c are integers. In some embodiments the amine reactant comprises a di-amine, tri-amine, tetra-amine or penta-amine. In some embodiments the amine reactant comprises an ethylene diamine or propyl triamine.

In some embodiments the substrate is contacted with an oxidizing reactant after at least one deposition cycle. In some embodiments the oxidizing reactant is selected from the group consisting of $O_2$, $O_3$, $H_2O_3$, $H_2O$, oxygen plasma, and oxygen radicals.

In some embodiments the silicon precursor comprises octachlorotrisilane and the amine reactant comprises ethylene diamine.

DETAILED DESCRIPTION

Silicon-containing thin films, such as SiCN films and SiOCN films, have a wide variety of applications, for example in integrated circuit fabrication. In some embodiments, the silicon-containing films described herein may be used as, for example, dielectric layers, etch stop layers, sacrificial layers, low-k spacers, anti-reflection layers (ARL), passivation layers and in gap fill applications.

According to some embodiments, various silicon-containing films, precursors, and methods for depositing said films by vapor deposition, such as by atomic layer deposition (ALD), are provided. In some embodiments the films comprise silicon, carbon and nitrogen and may be referred to as Si(C,N) films. In some embodiments the films comprise silicon, carbon, hydrogen, and nitrogen. In some embodiments the films are deposited by processes that do not use plasma, radicals or excited species. In some embodiments the films are deposited using non-oxidative processes; that is, processes that do not use an oxidizing agent. In some embodiments the processes do not use an oxidizing agent such as $O_2$, $O_3$, $H_2O_2$, $H_2O$, oxygen plasma or oxygen radicals.

In some embodiments the silicon-containing thin films are not deposited by liquid phase methods. In some embodiments a silicon-containing thin film is deposited over a three-dimensional structure, such as a fin in the formation of a FinFET device.

In some embodiments SiCN films are deposited. In some embodiments SiOCN films are deposited. In some embodiments SiCN films may be deposited and further treated to form SiOCN films.

In some embodiments the silicon-containing films, for example films containing silicon, carbon, hydrogen, and nitrogen, are deposited by a vapor phase molecular layer deposition (MLD) processes comprising contacting the substrate with one or more silicon halides and one or more organic amines. Exemplary reactants are described below. In some embodiments cyclic vapor deposition processes are used to deposit silicon-containing films, such as SiCN films. For example, ALD or cyclic CVD processes may be utilized. In some embodiments vapor deposition processes for forming SiCN films as described herein do not utilize plasma.

In some embodiments, ALD processes are used to deposit SiCN films. In some embodiments ALD processes for forming SiCN films as described herein do not utilize plasma. ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example, with an inert gas.

In some embodiment the processes for forming silicon-containing thin films, such as SiCN films, do not utilize an oxidizing reactant. For example, in some embodiments processes for forming SiCN films do not utilize an oxidizing reactant such as $O_2$, $O_3$, $H_2O_2$, $H_2O$, oxygen plasma or oxygen radicals. In some embodiments, a post-deposition treatment step can utilize plasma or other reactive species such as oxygen plasma, ozone plasma, hydrogen peroxide or ozone. In some embodiments, a post-deposition treatment plasma step utilizes nitrogen, hydrogen, $N_2$—$H_2$ or argon plasma. In some embodiments a post-deposition treatment step is utilized to tune the film properties. In some embodiments a post-deposition treatment step is carried out after one, two, three or more deposition cycles. In some embodiments a post-deposition treatment step is carried out after deposition of a certain thickness of the silicon-containing thin film. In some embodiments a post-deposition treatment step is carried out at one, two or more intervals in a deposition process.

Briefly, in some embodiments of a vapor-deposition process, a substrate or workpiece is placed in a reaction chamber and subjected to alternately repeated surface reactions. In some embodiments silicon-containing films, such as SiCN thin films, are deposited by a deposition process, such as a cyclic deposition process, in which the substrate is exposed to a vapor-phase silicon precursor and a vapor-phase second reactant. In some embodiments the process is a cyclic CVD process. In some embodiments, SiCN thin films are formed by repetition of a cycle in which the substrate is alternately contacted with a silicon precursor and a second reactant. In some embodiments the cycle is an ALD cycle in which the substrate is alternately and sequentially contacted with the silicon precursor and second reactant. As discussed below, in some embodiments the silicon precursor is a silicon halide and the second reactant comprises an amine. In some embodiments the second reactant is not $NH_3$.

In some embodiments, for forming silicon-containing films such as SiCN films, each deposition cycle comprises at least two distinct phases. The contacting and removal of a reactant from the substrate may be considered a phase. Additional phases may be added in some embodiments to achieve a desired composition. The reaction conditions, such as temperature, reactants, pressure, etc., may be tuned to produce a film with the desired characteristics.

In a first phase, a vapor phase first reactant comprising a silicon precursor, such as a silicon halide, contacts the substrate and forms no more than about one monolayer of silicon species on the substrate surface. In some embodiments the silicon reactant comprises silicon atoms attached to one or more halide atoms and can be bridged by atoms or chains of atoms such as carbon, hydrogen, oxygen, and/or nitrogen atoms. This reactant is also referred to herein as "the silicon precursor," "silicon-containing precursor," or "silicon reactant". This phase can be referred to as the "silicon phase".

In some embodiments a silicon precursor is a bis(trichlorosilyl)alkane, bis(tribromosilyl)alkane, or bis(triiodosilyl) alkane, such as bis(trichlorosilyl)methane, bis(trichlorosilyl) ethane, bis(triiodosilyl)ethane and bis(trichlorosilyl) benzene. In some embodiments a silicon precursor is an octachlorotrisiloxane or hexachlorodisiloxane.

In some embodiments the silicon precursor may have a general formula, $X_aY_{3-a}$—Si—R(Ar)—Si—$X_bY_{3-b}$, wherein 'X' is a halide such as fluorine, chlorine, bromine or iodine and 'Y' can be either hydrogen, or an alkyl or alkoxy group and a and b are integers greater than or equal to one, and wherein 'R' can be either a substituted or unsubstituted, either saturated or unsaturated, branched or linear alkyl chain and 'Ar' is a substituted or unsubstituted aromatic group such as benzene, methyl benzene or nitro benzene. In some embodiments, an alkyl or aryl bridge can contain carbon atoms, for example greater than or equal to 1, greater than 3 or up to 10 carbon atoms. It is to be understood that any alkyl or aryl groups may contain hydrogen that are not explicitly described here. In some embodiments the silicon precursors may have more than two silicon atoms bridged by either an alkyl or aromatic groups.

In some embodiments the silicon precursor comprises a silane having at least one halogen. In some embodiments the silicon precursor is a linear, branched or cyclic halosilane. In some embodiments the silicon precursor may have a general formula:

$$Si_nX_{2n+2} \text{ or } Si_nX_{2n+2-c}L_c$$

wherein n and c are integers greater than or equal to 1, L is a ligand and X is a halogen. In some embodiments X may be Cl, F, Br or I. In some embodiments, L can be hydrogen, alkyl such as methyl or alkoxy. In some embodiments the silicon precursor comprises two or more different halides.

In some embodiments the silicon precursor is a carbon substituted halosilane, such as an alkylhalosilane. In some embodiments the silicon precursor is an alkyl bridged halosilane.

In some embodiments the silicon precursor may be, for example, octachlorotrisilane (OCTS), hexachlorodisilane (HCDS), alkyl substituted halo silane such as methylpentachlorodisilane, dimethylhexachlorotrisilane, silicon tetrachloride, dichlorosilane, diiodosilane, silicon tetraiodide ($SiI_4$), pentachlorodisilane or trichlorosilane.

In a second phase, a second reactant comprising an amine reactant contacts the substrate. This phase can be referred to as the "amine phase" and the reactant may be referred to as the "amine reactant". In some embodiments the amine is a diamine or triamine. In some embodiments the amine has the formula $C_aN_bH_c$ where a, b and c are integers and are greater than or equal to 1. In some embodiments b is greater than or equal to 2. In some embodiments the amine may comprise a saturated or unsaturated ligand, such as a saturated or unsaturated alkyl or aryl group. In some embodiments the amine may be an aromatic amine, such as an aromatic di-amine, or tri-amine, or tetra-amine or even penta-amine. In some embodiments the organic amine is tetraethylenepentamine, triethylenetetramine, ethylene diamine, or diethylenetriamine. In some embodiments the amine may have the formula $NH_2$—R—$NH_2$, where R is a saturated or unsaturated alkyl or aryl group, or $NH_2$—Ar—$NH_2$, where Ar represents an aromatic. In some embodiments the second reactant comprises ethylene diamine. In some embodiments the second reactant comprises propyl triamine. In some embodiments an amine reactant may contain up to 20 carbon atoms, less than 15 carbon atoms, less than 10 carbon atoms, or up to 6 carbon atoms. In some embodiments an amine reactant may contain up to 10 nitrogen atoms, less than 6 carbon atoms, or 1-5 nitrogen atoms. Any alkyl or aryl groups in the organic amines may contain hydrogen atoms that are not explicitly described here.

In some embodiments one or more deposition cycles may be carried out at a process temperature that is less than about 600° C., less than about 500° C., or less than about 450° C. In some embodiments the deposition temperature is about 150° C. to about 450° C., or about 200° C. to about 350° C. In some embodiments the deposition cycle may be carried out at a process temperature of less than or equal to about 350° C. In some embodiments the deposition cycle may be carried out at a process temperature of about 100° C. or greater. The deposition temperature may be adjusted to achieve a thin film with a desired composition and characteristics. For example, the temperature may be adjusted to achieve a desired N and/or C concentration in the film.

In some embodiments the substrate is not contacted with a reactive species generated by a plasma during one or more deposition cycles. In some embodiments the substrate is not contacted with a reactive species generated by a plasma in any deposition cycle.

Additional phases may be added and phases may be removed as desired to adjust the composition of the final film. For example, an oxidation phase may be included in one or more deposition cycles, or following a number of deposition cycles, to form SiOCN. In some embodiments an oxidant may be used, such as air, $O_2$, $O_3$, $H_2O_3$, $H_2O$, oxygen plasma or oxygen radicals.

In some embodiments one or more of the phases may be repeated two or more times in a single deposition cycle. For example, in some embodiments a deposition process may comprise contacting the substrate with the first reactant two or more times prior to contacting the substrate with the second reactant.

In some embodiments one or more different deposition cycles are provided in the deposition process.

One or more of the silicon precursor and second reactant may be provided with the aid of a carrier gas, such as Ar or He. In some embodiments the silicon precursor and the second reactant are provided with the aid of a carrier gas.

In some embodiments an optional or supplementary step comprises exposing the substrate to one or more heterocyclic compounds containing carbon, nitrogen, sulfur, oxygen or hydrogen atoms. In some embodiments a heterocyclic compound is pyridine, alkyl substituted pyridines, pyrrole, imidazole, triazole, thiophene, etc. In some embodiments a heterocyclic compound is continuously or intermittently flown throughout the deposition process into the reaction chamber. In some embodiments a heterocyclic compound is flown as a post-deposition process. One or more heterocyclic compounds may be included in a purge step in which one or more reactants or reaction by-products are removed from the substrate. For example, in some embodiments a supplementary or optional step is a purge step in which the substrate is exposed to a purge gas. In some embodiments a supplementary step is performed in addition to a nitrogen ($N_2$) or argon purge step. In some embodiments a purge step comprises exposing the substrate to a non-reactive gas, such as diatomic nitrogen or argon, and a heterocyclic compound, for example pyridine, alkyl substituted pyridines, pyrrole, imidazole, pyrimidine, thiophene, etc.

In some embodiments, two or more of the phases may overlap, or be combined. For example, the silicon precursor and the amine reactant may contact the substrate simultaneously in phases that partially or completely overlap. In addition, although referred to as the first and second phases, and the first and second reactants, the numbering does not necessarily specify the order of the phases or the order in which the substrate is contacted with reactants. That is, the order of the phases may be varied. Each ALD cycle may begin with any one of the phases. In some embodiments a deposition cycle may begin with contacting the substrate with the silicon precursor followed by contacting the substrate with the amine reactant. In some embodiments a deposition cycle may begin with contacting the substrate with the amine reactant followed by contacting the substrate with the silicon precursor. Unless specified otherwise, the reactants can contact the substrate in any order, and the process may begin with any of the reactants.

In some embodiments a third oxidation phase is utilized to form a SiOCN film. In some embodiments the oxidation phase is utilized in every deposition cycle. In some embodiments the oxidation phase is only included after a certain number of deposition cycles. That is, a deposition cycle including the oxidation phase may be included after a SiCN film of a desired thickness has been formed. In some embodiments an oxidation phase is not included in any deposition cycles. In some embodiments after deposition of a SiCN film of a desired thickness an oxidizing treatment is carried out to convert the SiCN to SiOCN. In embodiments in which a SiOCN film is formed, the silicon precursor may comprise a silicon reactant comprising oxygen, such as a siloxane, for example hexachlorodisiloxane or octachlorotrisiloxane.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination.

Excess reactant and reaction byproducts, if any, are removed from the vicinity of the substrate, and in particular, from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films. In some embodiments the substrate may be moved such that it is contacted with one reactant at a time.

In some embodiments a gas is provided to the reaction chamber continuously during each deposition cycle, or during the entire ALD process. In some embodiments the gas may comprise noble gas, such as helium or argon. The flowing gas may serve as a carrier gas for one or more of the reactants and may also serve as a purge gas.

In some embodiments a gas is provided to the reaction chamber continuously during each deposition cycle, or during the entire deposition process. In some embodiments the gas may comprise one or more heterocyclic compounds, ammonia, hydrazine or any alkyl substituted hydrazine.

The deposition cycle is repeated until a film of the desired thickness and composition is obtained. In some embodiments the deposition parameters, such as the temperature, precursor flow rate, contacting time, removal time, and/or reactants themselves, may be varied in one or more deposition cycles during the ALD process in order to obtain a film with the desired composition and characteristics.

In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse, and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, after an initial surface termination, if necessary or desired, the substrate is contacted with a first silicon halide reactant. For example, a first silicon reactant pulse may be supplied to a reaction chamber comprising the substrate. In accordance with some embodiments, the silicon reactant comprises a volatile silicon halosilane species, such as octachlorotrisilane, that is reactive with the substrate surfaces of interest. Accordingly, species of the silicon reactant adsorbs upon these substrate surfaces. In some embodiments the first reactant pulse self-saturates the substrate surfaces such that any excess constituents of the first reactant do not further react with a molecular layer of silicon species formed on the substrate in this part of the deposition cycle.

Each reactant can be supplied in gaseous form. The reactant is considered "volatile" for purposes of the present description if the species exhibits sufficient vapor pressure under the process conditions to transport the species to the reaction chamber in sufficient concentration to saturate exposed surfaces of the substrate.

In some embodiments the silicon reactant contacts the substrate surface for a period of time from about 0.05 seconds to about 5.0 seconds, about 0.1 seconds to about 3 seconds, or about 0.2 seconds to about 1.0 seconds. The optimum contacting time can be determined by the skilled artisan based on the particular circumstances.

After sufficient time for about a molecular layer of silicon species to form on the substrate surface, excess first silicon reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas or by flowing a purge gas for a sufficient time to diffuse or purge excess reactants and reactant byproducts, if any, from the reaction space. In some embodiments the excess first silicon precursor is purged with the aid of inert gas, such as nitrogen or argon, which may be flowing throughout the deposition cycle. In some embodiments the substrate may be moved from the reaction space containing the first reactant to a second, different reaction space. In some embodiments, the first reactant is removed for about 0.1 seconds to about 10 seconds, about 0.3 seconds to about 5 seconds, or about 0.3 seconds to about 1 second. Contacting and removal of the silicon reactant can be considered the first or silicon phase of the deposition cycle.

In the second phase, the substrate is contacted with a second reactant comprising an amine, such as a diamine or triamine. The amine reactant may be provided to the substrate in one or more reactant pulses. In some embodiments the second reactant is provided in two or more distinct pulses, without introducing another reactant in between any of the two or more pulses. For example, in some embodiments a diamine or triamine is provided in two or more sequential pulses, without introducing a silicon precursor in between the sequential pulses.

In some embodiments the second reactant contacts the substrate for about 0.1 seconds to about 10 seconds. In some embodiments the second reactant contacts the substrate for about 0.1 seconds to about 10 seconds, about 0.5 seconds to about 5 seconds, or about 0.5 seconds to about 2.0 seconds. However, depending on the reactor type, substrate type and its surface area, the second reactant contacting time may be even longer than about 10 seconds. In some embodiments, the contacting times can be on the order of minutes.

After sufficient time for the second reactant to react with the silicon species on the substrate surface, excess second reactant and reaction byproducts, if any, are removed from the substrate surface. In some embodiments removing excess second reactant and reaction byproducts, if any, may comprise purging the reaction chamber. In some embodiments the reaction chamber may be purged by stopping the flow of the second reactant while continuing to flow a carrier gas or by flowing a purge gas for a sufficient time to diffuse or purge excess reactants and reactant byproducts, if any, from the reaction space. In some embodiments the excess second reactant is purged with the aid of inert gas, such as nitrogen or argon, which may be flowing throughout the deposition cycle. In some embodiments the substrate may be moved from the reaction space containing the second reactant to a different reaction space. In some embodiments, the second reactant is removed for about 0.1 seconds to about 10 seconds, about 0.3 seconds to about 5 seconds, or about 0.3 seconds to about 1 second. Contacting and removal of the second reactant can be considered the second phase of the deposition cycle.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example, the substrate may comprise an amorphous carbon layer, graphene, and/or carbon nanotubes.

In some embodiments the substrate may comprise a metal, including, but not limited to W, Cu, Ni, Co, and/or Al. In some embodiments the substrate may comprise a metal nitride, including, but not limited to TiN and/or TaN. In some embodiments the substrate may comprise a metal carbide, including, but not limited to Ti(Al) C, TiC and/or TaC. In some embodiments the substrate may comprise a metal chalcogenide, including, but not limited to $MoS_2$, $Sb_2Te_3$, and/or GeTe. In some embodiments the substrate may comprise a material that would be oxidized or otherwise damaged by exposure to a reactive oxygen source such as an oxygen plasma.

In some embodiments a substrate used in the vapor deposition processes, for example, the ALD processes, described herein may comprise an organic material. For example, the substrate may comprise an organic material such as a plastic, polymer, and/or photoresist. In some embodiments where the substrate comprises an organic material, the reaction temperature, such as of an ALD process, may be less than about 300° C., or less than about 200° C. In some embodiments the reaction temperature may be less than about 150° C., less than about 100° C., less than about 75° C., or less than about 50° C.

In some embodiments where a substrate comprises an organic material, the maximum process temperature may be as low as about 100° C. In some embodiments where the substrate comprises an organic material, the absence of a plasma or an oxidant may allow for deposition of a SiCN thin film on an organic material that may otherwise degrade in a deposition process including a plasma generated from oxygen or other reactive oxygen species.

According to some embodiments, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiCN deposition process can be performed at a pressure of about 20 Torr to about 500 Torr, about 20 Torr to about 50 Torr, or about 20 Torr to about 30 Torr.

In some embodiments a deposition process for a silicon-containing thin film, such as a SiCN film, can comprise a plurality of deposition cycles, wherein at least one deposition cycle is performed in an elevated pressure regime. For example, a deposition cycle may comprise alternately and sequentially contacting the substrate with a silicon precursor and a second reactant under the elevated pressure. In some embodiments, one or more deposition cycles can be performed at a process pressure of about 6 Torr to about 500 Torr, about 6 Torr to about 100 Torr, or about 6 Torr to about 50 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

Figure 1:
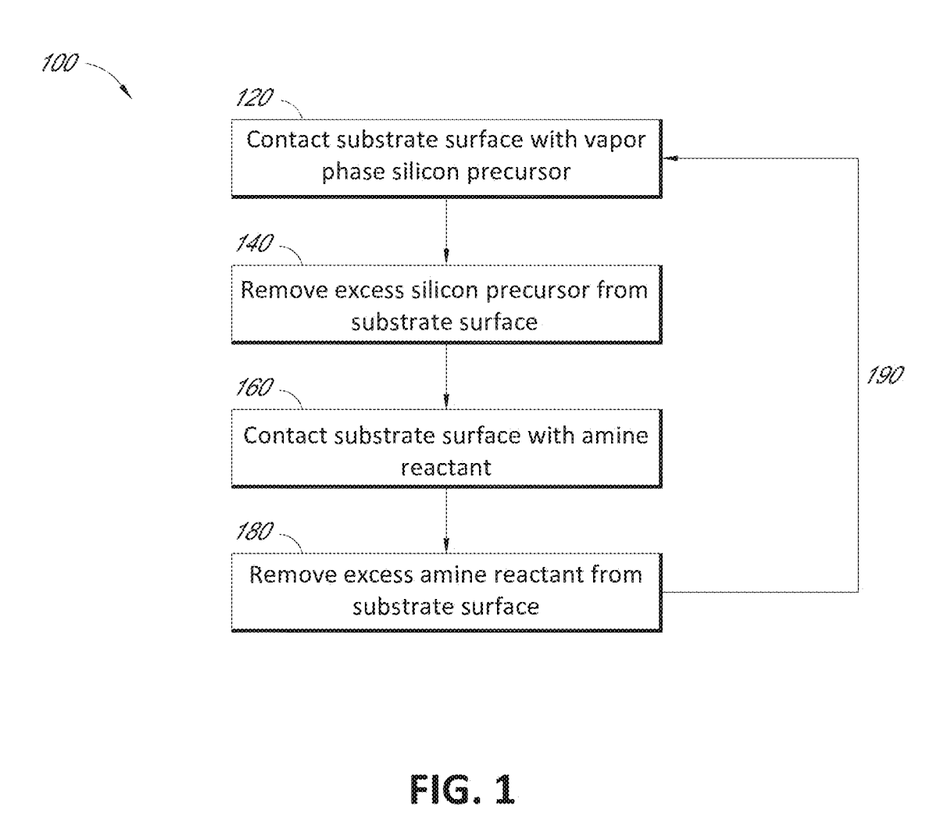
FIG. 1 is a process flow diagram for depositing SiCN thin film by an atomic layer deposition (ALD) process according to some embodiments.

In some embodiments a silicon precursor such as a halosilane is utilized in a deposition cycle with an amine reactant. Referring to FIG. 1 and according to some embodiments, a silicon-containing thin film is deposited on a substrate in a reaction space by an ALD deposition process 100 comprising one or more deposition cycles comprising:
  contacting the substrate with a vapor phase silicon precursor, such as a halosilane, for example octachlorotrisilane, at step 120 such that silicon species are adsorbed onto the surface of the substrate;
  removing excess silicon precursor and reaction byproducts, if any, from the substrate surface at step 140;
  contacting the substrate with a second reactant comprising an amine, such as a diamine or triamine at step 160; and
  removing excess amine reactant and reaction byproducts, if any, from the substrate surface at step 180.

The deposition cycle including steps 120, 140, 160 and 180 may be repeated 190 to form a SiCN film of the desired thickness.

In some embodiments the substrate is alternately and sequentially contacted with a silicon precursor and the amine reactant in a deposition cycle. In some embodiments a substrate is alternately and sequentially contacted with a halosilane and a diamine or triamine. In some embodiments the substrate is alternately and sequentially contacted with octachlorotrisilane and ethylene diamine.

The temperature of the deposition process illustrated in FIG. 1 may be varied to achieve a desired film. In some embodiments a temperature of about 200° C. to about 400° C. is utilized and a SiCN film is formed. In some embodiments the temperature may be from about 250° C. to about 350° C. The nitrogen and carbon concentration may be tuned by adjusting the temperature, precursor dose and/or purge times.

Figure 2:
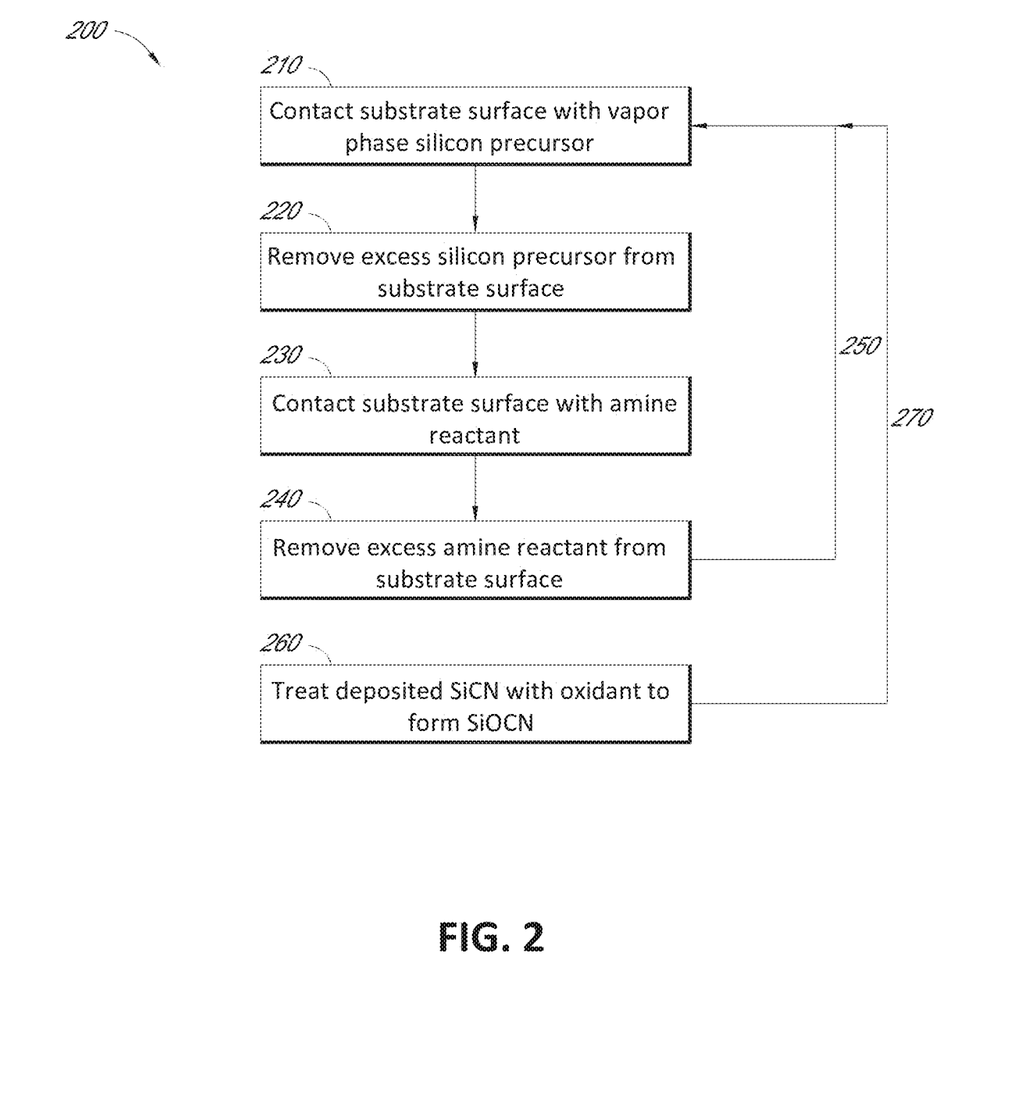
FIG. 2 is a process flow diagram for depositing a SiOCN thin film by an ALD process according to some embodiments.

In some embodiments after multiple deposition cycles for forming SiCN, the substrate is contacted with an oxidant to form SiOCN. With reference to FIG. 2 and according to some embodiments, a silicon-containing thin film is deposited on a substrate in a reaction space by an ALD deposition process 200 comprising at least one cycle comprising:
  contacting the substrate with a vapor phase silicon precursor, such as a halosilane, for example octachlorotrisilane, at step 210 such that silicon species are adsorbed onto the surface of the substrate;
  removing excess silicon precursor and reaction byproducts, if any, from the substrate surface at step 220;
  contacting the substrate with a second reactant comprising an amine, such as a diamine or triamine at step 230; and
  removing excess amine reactant and reaction byproducts, if any, from the substrate surface at step 240.

The deposition cycle including steps 210, 220, 230, 240 may be repeated 250 multiple times to form a SiCN film of the desired thickness. When a desired thickness has been achieved, the SiCN film may be treated with an oxidant 260 to convert some or all of the deposited SiCN to SiOCN.

In some embodiments, following oxidant treatment, additional cycles of SiCN deposition and subsequent oxidation are carried out 270. Oxidation may be done using an oxidizing agent such as air, water, oxygen, ozone, hydrogen peroxide, or oxygen plasma, such as $O_2/O_3$ plasma.

SiCN Film Characteristics

Silicon-containing thin films, such as SiCN thin films, deposited according to some of the embodiments discussed herein may achieve impurity levels or concentrations of one or more impurities below about 3 at %, below about 1 at %, below about 0.5 at %, or below about 0.1 at %. In some thin films, the total impurity level excluding hydrogen may be below about 5 at %, below about 2 at %, below about 1 at %, or below about 0.2 at %. And in some thin films, hydrogen levels may be below about 30 at %, below about 20 at %, below about 15 at %, or below about 10 at %. As used herein, with respect to SiCN films, an impurity may be considered any element other than Si, C, and/or N.

According to some embodiments, the silicon-containing thin films, such as SiCN thin films, may exhibit step coverage greater than about 50%, greater than about 80%, greater than about 90%, or greater than about 95%. In some cases step coverage can be greater than about 98% and in some case about 100% (within the accuracy of the measurement tool or method). In some embodiments step coverage and pattern loading effects can be greater than about 100%, greater than about 110%, greater than about 120%, greater than about 130%, or greater than about 140%. These values can be achieved in features with aspect ratios of about 2 or greater, in some embodiments with aspect ratios of about 3 or greater, in some embodiments with aspect ratios of about 5 or greater and in some embodiments with aspect ratios of about 8 or greater.

In some embodiments the step coverage may be between about 50% and about 110%, between about 80% and about 110%, between about 90% and about 110%, between about 95% and about 110%, between about 98% and about 110%, or between about 100% and about 110%. In some embodiments the step coverage may be between about 50% and about 100%, between about between about 80% and about 100%, between about 90% and about 100%, between about 95% and about 100%, or between about 98% and 100%.

In some embodiments the growth rate of the film is from about 0.01 Å/cycle to about 1 Å/cycle. In some embodiments the growth rate of the film is more than about 0.05 Å/cycle, more than about 0.1 Å/cycle, more than about 0.15 Å/cycle, more than about 0.2 Å/cycle, more than about 0.5 Å/cycle, more than about 1 Å/cycle, more than about 2 Å/cycle, or even more than about 5 Å/cycle.

In some embodiments, silicon-containing thin films, such as SiCN films, are deposited to a thickness of from about 3 nm to about 50 nm, from about 5 nm to about 30 nm, from about 5 nm to about 20 nm. These thicknesses can be achieved in feature sizes (width) below about 100 nm, below about 50 nm, below about 30 nm, below about 20 nm, and in some cases below about 15 nm. According to some embodiments, a SiCN film is deposited on a three-dimensional structure and the thickness at a sidewall may be slightly even more than about 10 nm. In some embodiments silicon-containing thin films, such as SiCN films, of greater than about 50 nm can be deposited. In some embodiments silicon-containing thin films, such as SiCN films, of greater than about 100 nm can be deposited. In some embodiments, silicon-containing thin films, such as SiCN films, are deposited to a thickness of more than about 1 nm, more than about 2 nm, more than about 3 nm, more than about 5 nm, more than about 10 nm.

According to some embodiments silicon-containing thin films, such as SiCN films, with various wet etch rates (WER) may be deposited. In some embodiments when using a blanket WER in 0.5% dHF (nm/min), SiCN films may have WER values of less than about 50 nm/min. In some embodiments SiCN films may have WER values of greater than about 30 nm/min in 0.5% dHF.

In some embodiments the k-value is less than about 10, less than about 7, or less than about 5. In some embodiments the nitrogen content is below about 40 at %, or below about 30 at %, or below about 25 at %, or below about 15 at %, or below about 10 at %, or below about 5 at % and the carbon content is below about 40 at %, below about 30 at %, below about 25 at %, below about 15 at %, below about 10 at %, or below about 5 at %.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, or less than about 10 at % or less than about 5 at %.

In some embodiments the deposited silicon-containing thin films, such as SiCN thin films, may contain up to about 40% carbon on an atomic basis (at %). In some embodiments the deposited silicon-containing thin films, such as SiCN thin films, may contain up to about 50% silicon on an atomic basis (at %). In some embodiments a silicon-containing thin films, such as a SiCN film, may comprise silicon from about 10% to about 50%, from about 15% to about 40%, or from about 20% to about 35% on an atomic basis. In some embodiments a silicon-containing thin film, such as a SiCN film, may comprise at least about 15%, about 20%, about 25%, or about 30% silicon on an atomic basis.

In some embodiments a silicon-containing thin films, such as a SiCN film, is a continuous film. In some embodiments a SiCN film has a k-value that is less than about 10. In some embodiments a SiCN film has a k-value that is less than about 5. For example, in some embodiments a SiCN film that is deposited at a temperature of about 200° C. to about 400° C. may have a k-value of less than about 5. In some embodiments a SiCN film has a k-value from about 4 to about 10.

In some embodiments silicon-containing thin films, such as a SiCN film, deposited according to the present disclosure do not comprise a laminate or nanolaminate structure.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes, or nanoparticles, or even single, partial or full molecular layers, or partial or full atomic layers, or clusters of atoms and/or molecules. "Films" and "thin films" may comprise materials or layers with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a silicon-containing thin film on a substrate in a reaction space by an atomic layer deposition (ALD) process comprising at least one deposition cycle comprising:
   contacting the substrate with a vapor phase silicon precursor comprising a halogen; and
   contacting the substrate with an amine reactant, wherein a plasma reactant is not utilized in the deposition cycle,
   wherein the silicon precursor comprises a bridged halosilane, wherein the bridged halosilane comprises an aryl bridge, an oxygen bridge, or has a formula $X_aY_{3-a}$—Si—R(Ar)—Si—$X_bY_{3-b}$, wherein X is fluorine (F), chlorine (Cl), bromine (Br) or iodine (I), Y is hydrogen, an alkyl group, or an alkoxy group and a and b are integers greater than or equal to one, wherein R is a substituted or unsubstituted, either saturated or unsaturated, branched or linear alkyl chain, and Ar is a substituted or unsubstituted aromatic group,
   and
   wherein the silicon-containing thin film comprises a SiCN film.

2. The method of claim 1, wherein the silicon precursor comprises bis(trichlorosilyl)benzene.

3. The method of claim 1, wherein the amine reactant has a formula $C_aN_bH_c$, wherein a, b and c are integers.

4. The method of claim 1, wherein the amine reactant comprises an ethylene diamine or propyl triamine.

5. The method of claim 1, wherein the silicon precursor comprises a bridged halosilane having a formula $X_aY_{3-a}$—Si—R(Ar)—Si—$X_bY_{3-b}$, wherein Ar is benzene, methyl benzene or nitro benzene.

6. The method of claim 1, wherein the silicon precursor comprises an octachlorosiloxane or hexachlorodisiloxane.

7. The method of claim 1, additionally comprising contacting the substrate with an oxidizing reactant after at least one deposition cycle to form SiOCN.

8. The method of claim 7, wherein the oxidizing reactant is selected from the group consisting of $O_2$, $O_3$, hydrogen peroxide, $H_2O$, oxygen plasma, and oxygen radicals.

9. The method of claim 1, wherein no plasma reactant is used in the ALD process.

10. A method of forming a SiCN thin film on a substrate comprising alternately and sequentially contacting the substrate with a silicon precursor comprising a halogen and an amine reactant, wherein the method does not utilize plasma, and wherein the silicon precursor comprises a bridged halosilane, wherein the bridged halosilane comprises an aryl bridge, an oxygen bridge, or has a formula $X_aY_{3-a}$—Si—R(Ar)—Si—$X_bY_{3-b}$, wherein X is fluorine (F), chlorine (Cl), bromine (Br) or iodine (I), Y is hydrogen, an alkyl group, or an alkoxy group and a and b are integers greater than or equal to one, wherein R is a substituted or unsubstituted, either saturated or unsaturated, branched or linear alkyl chain, and Ar is a substituted or unsubstituted aromatic group.

11. The method of claim 10, wherein the substrate is contacted with the silicon precursor and the amine reactant at a temperature of about 200 to about 400° C.

12. The method of claim 10, wherein the silicon precursor comprises two different halogens.

13. The method of claim 10, wherein the amine reactant comprises a diamine or triamine.

14. The method of claim 13, wherein the amine reactant comprises an ethylene diamine or a propyl triamine.

15. The method of claim 10, wherein the amine reactant has a formula $C_aN_bH_c$, wherein a, b and c are integers.

* * * * *